US012775096B2

(12) United States Patent
Gilbergs et al.

(10) Patent No.: US 12,775,096 B2
(45) Date of Patent: Oct. 27, 2026

(54) LIDAR SYSTEM HAVING INTERFERENCE SOURCE DETECTION

(71) Applicant: Robert Bosch GmbH, Stuttgart (DE)

(72) Inventors: Holger Maris Gilbergs, Sersheim (DE); Johannes Richter, Ludwigsburg (DE); Karl Christoph Goedel, Vaihingen An der Enz (DE); Simon Bell, Sersheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1156 days.

(21) Appl. No.: 17/450,933

(22) Filed: Oct. 14, 2021

(65) Prior Publication Data

US 2022/0120911 A1 Apr. 21, 2022

(30) Foreign Application Priority Data

Oct. 19, 2020 (DE) ......................... 102020213163.5

(51) Int. Cl.
*G01S 17/931* (2020.01)
*G01S 7/02* (2006.01)
(Continued)

(52) U.S. Cl.
CPC ............ *G01S 17/931* (2020.01); *G01S 7/023* (2013.01); *G01S 7/4813* (2013.01); *G01S 7/497* (2013.01);
(Continued)

(58) Field of Classification Search
CPC ...... G01S 17/931; G01S 7/023; G01S 7/4813; G01S 7/497; G01S 17/02; G01S 17/08;
(Continued)

(56) References Cited

U.S. PATENT DOCUMENTS

2016/0025842 A1 1/2016 Anderson et al.
2018/0143298 A1 5/2018 Newman
(Continued)

FOREIGN PATENT DOCUMENTS

CN 108760710 A 11/2018
CN 111427024 A 7/2020
(Continued)

OTHER PUBLICATIONS

English machine translation of DE 102018217484 (Year: 2018).*
(Continued)

*Primary Examiner* — Dominic J Bologna
(74) *Attorney, Agent, or Firm* — NORTON ROSE FULBRIGHT US LLP

(57) ABSTRACT

A lidar system having interference source detection, in particular, for a vehicle. An emitter unit and a detector unit are provided, so that reflected light for sampling a surrounding area may be detected. The light emitted by the emitter unit travels through a window out of the housing, and the light reflected by the surrounding area travels through the window into the housing. At least one secondary detector is provided, which is attached to a coupling-out surface of the window. The secondary detector is configured to detect scattered light propagating inside of the window. The lidar system includes a control unit, which is configured to evaluate scattered light detected by the at least one secondary detector, in order to detect interference sources on or in the window.

11 Claims, 3 Drawing Sheets

(51) Int. Cl.

| | |
|---|---|
| ***G01S 7/481*** | (2006.01) |
| ***G01S 7/497*** | (2006.01) |
| ***G01S 17/02*** | (2020.01) |
| ***G01S 17/08*** | (2006.01) |
| ***G01S 17/42*** | (2006.01) |
| ***H10F 30/225*** | (2025.01) |

(52) U.S. Cl.
CPC .............. *G01S 17/02* (2013.01); *G01S 17/08* (2013.01); *G01S 17/42* (2013.01); *H10F 30/225* (2025.01); *G01S 2007/4975* (2013.01)

(58) Field of Classification Search
CPC . G01S 17/42; G01S 2007/4975; H10F 30/225
See application file for complete search history.

(56) References Cited

U.S. PATENT DOCUMENTS

| | | | | |
|---|---|---|---|---|
| 2018/0284268 | A1* | 10/2018 | McWhirter | G01S 7/4816 |
| 2018/0284274 | A1* | 10/2018 | LaChapelle | G01S 7/4817 |
| 2018/0284275 | A1* | 10/2018 | LaChapelle | G01S 7/4816 |
| 2020/0200873 | A1* | 6/2020 | Schmidt | G01S 17/931 |
| 2020/0284906 | A1* | 9/2020 | Eichenholz | G02B 27/0955 |

FOREIGN PATENT DOCUMENTS

| | | | | |
|---|---|---|---|---|
| DE | 102006045916 | A1 * | 4/2008 | G01N 21/958 |
| DE | 102018217484 | A1 * | 4/2020 | G01S 7/497 |
| DE | 102018217488 | A1 | 4/2020 | |
| JP | H1090412 | A | 4/1998 | |
| JP | 2003042757 | A | 2/2003 | |
| JP | 2017067559 | A | 4/2017 | |
| JP | 2018179984 | A | 11/2018 | |
| JP | 2020030121 | A | 2/2020 | |
| WO | 2016208373 | A1 | 12/2016 | |

OTHER PUBLICATIONS

English machine translation of DE 102006045916 (Year: 2006).*
English machine translation of DE102018217484A1 (Year: 2018).*
English machine translation of DE102006045916A1 (Year: 2006).*

* cited by examiner

LIDAR SYSTEM HAVING INTERFERENCE SOURCE DETECTION

CROSS REFERENCE

The present application claims the benefit under 35 U.S.C. 119 of German Patent Application No. DE 102020213163.5 filed on Oct. 19, 2020, which is expressly incorporated herein by reference in its entirety.

FIELD

The present invention relates to a lidar system having interference source detection, in particular, for a vehicle, the lidar system including an emitter unit having at least one light source; a detector unit having at least one primary detector, which is configured to detect reflected light of at least one light beam emitted by the emitter unit, in order to scan a surrounding area for detecting objects in the surrounding area; and a housing having a window, through which the light emitted by the emitter unit travels out of the housing and light reflected by the surrounding area arrives in the housing.

BACKGROUND INFORMATION

Lidar (light detection and ranging) systems function by emitting a light beam and measuring the portion of the light, which is reflected by the surrounding area. The emitter unit and detector unit are typically protected from environmental influences by a window (glass or any other material of optical quality, with or without additional coatings). Interference sources on or in this window, such as scratches, dirt or water drops, may interfere with the optical path and degrade the signal quality. By nature, this degradation may not be distinguished easily from external influences on the signal-to-noise ratio (such as sunlight or surrounding-area objects having low reflectivity). The window may be, for example, a glass pane or plastic pane, which is preferably substantially transparent to at least (near) infrared light.

The window is a refracting optical element, through which the signal light passes twice. Once when it is emitted into the environment, and once more on the way back to the detector unit. In the case of a dry and smooth surface, essentially all of the photons are either transmitted through the window or reflected back to the interior of the sensor. However, interference sources on or inside of the window reduce or block the transmittance of the window locally and may thus interfere with the functioning of the lidar system in a sensitive manner.

In the related art, for example, a software-based estimate of the reduction in range in the field of view is used, which, however, only allows contamination to be detected slowly (with lags in the range of minutes and longer). For highly automated vehicles along the lines of level 4 or 5, however, detection in the range of seconds or faster is necessary, in order to be able to respond sufficiently rapidly to the changed availability of the sensor.

A lidar system, which provides such a software-based, comparative design approach, is described in U.S. Patent Application Publication No. US 2018/0143298. A plurality of sensors are used, in order to monitor an area surrounding a portion of a vehicle. The output of the sensors is compared, in order to determine if one of the sensors is blocked. This determination may be made by comparing the output of a sensor to another, by determining if the output of a sensor lies within a predefined threshold value, or by comparing the characteristics of a plurality of sensor outputs to each other. If it is determined that a sensor is blocked, the system may transmit a command to a cleaning system, in order to eliminate the blockage automatically. However, this design approach requires a standardized environment or at least a stationary vehicle, in order to allow direct comparability of the measurements of the sensors, with rapid detection of interference sources. During vehicle operation, direct comparison is rendered difficult by the constant change of the surrounding area, and as a rule, a long-term measurement is necessary, in order to identify an interference source, using, e.g., a comparison of the sensor data averaged over time.

SUMMARY

An example embodiment of the present invention provides a lidar system of the type mentioned at the outset, including at least one secondary detector, which is attached to a coupling-out surface of the window; the secondary detector being configured to detect the scattered light propagating inside of the window; and the lidar system including a control unit, which is configured to evaluate scattered light detected by the at least one secondary detector, in order to detect interference sources on or in the window.

Roughness of the surface of the window, water drops, or contamination may cause scattering of the light in several directions or reflection in unintended directions. In the case of scratches (this means that the scattering takes place in the interior of the optical material of the window) and water drops (reflections at the water-to-air interface may result in reflections back into the material in a broad angular range), a portion of the light may have an angle relative to the (local) upper surface of the window, which is less than the angle of the total internal reflection. Thus, a portion of the scattered light generated by such permanent interference sources (e.g., scratches, cracks) or temporary interference sources (e.g., water drops, dirt) propagates inside of the window in a direction perpendicular to the main transmission direction and reaches the outer edges of the window (sometimes after one or more total internal reflections). Here, the direction, which stands (locally) perpendicularly to the surface of the window, and in which the emitted signal light runs substantially through the window, is meant as the main transmission direction.

In this case, this portion of the light remains inside of the window, which therefore acts, as it were, as a waveguide, and emerges from the window at the coupling-out surface. A detector attached to this coupling-out surface of the window is configured to detect the scattered light propagating inside of the window. Thus, in contrast to the related art, the secondary detector is positioned in such a manner, that it only detects light, which propagates inside of the window in a direction substantially perpendicular to the main transmission direction. In this manner, the secondary detector may detect a higher portion of scattered light in comparison with the useful light reflected back from the surrounding area, than if it were oriented in the direction of main transmission through the window. The control unit then evaluates the scattered light detected by the secondary detector, in order to detect interference sources on or in the window.

In this case, the term "attached to a coupling-out surface of the window" is to be understood to mean that the at least one secondary detector is preferably attached to a lateral surface or lateral edge of the window. However, the coupling-out surface may also be positioned at an outer side of the window, contrary to the main transmission direction through the window, and adjacent to a lateral surface or lateral edge of the window. In the latter case, as well, virtually only scattered light reaches the secondary detector, if the secondary detector is situated outside of the region of the window covered by the emitted laser light.

Thus, the coupling surface itself may be situated at a lateral edge of the window or in an edge region of the outer side of the window. The coupling-out surface may be a roughened surface of the window. The secondary detector may be placed in direct contact with the window surface, or the light may be coupled in through a material, which is positioned between them and has an index of refraction adapted to the window material.

The window may have, for example, the shape of a flat right parallelpiped; at least one secondary detector being attached to a coupling-out surface, and alternatively, a plurality of secondary detectors being attached to a plurality of coupling-out surfaces. However, the window may also have the shape of a thin section of a cylindrical shell (see also FIG. 3); the at least one secondary detector preferably being attached to a coupling-out surface, which runs perpendicularly to the polar direction (in cylindrical coordinates, parallel to an r-z plane). The latter design approach is preferred for lidar systems, which cover a large angular range, e.g., with the aid of a rotating mirror. The first design approach may be preferred, if the lidar system covers only a limited angular range, e.g., as a sensitive remote detector in interaction with other near-field detectors of a vehicle.

The scattered light, which reaches the at least one secondary detector at a coupling-out surface of the window, may have several sources. It may be coupled into the window either from the outside (sunlight, artificial light) or from the inside (light source of the lidar system). In the present application, the term "scattered light" is to be understood to describe all light, which has been deflected/reflected/refracted by an interference source in or on the window, e.g., thus, light reflected by a water drop, as well. To be sure, the external light may be used, in principle, for detecting interference sources, but use of the internal light source provides several advantages, which are explained in greater detail in the following specific embodiments.

By use of the secondary detector, the lidar system of the present invention may also allow more effective and more rapid detection of interference sources during operation of the lidar system, that is, for example, in a driving situation of a vehicle equipped with the lidar system. In particular, the detection of interference sources is also less of a function of the surrounding area than in the related art, since scattered light coming primarily or exclusively from the internal light source may be used and light reflected back from the surrounding area or other external light is not necessary for the detection of interference sources.

The control unit may be configured in such a manner, that an interference source is only identified in response to a predefined or adaptively corrected, minimum intensity of scattered light. An advantage of this is that, for example, very slight contamination of the surface of the window, a temporarily intense, external light source, or a highly reflective surrounding-area object, which may each result in a (sometimes temporary) increase in scattered light in the window, is not identified as a problematic interference source and does not trigger, for example, a false alarm.

In one specific embodiment of the present invention, the lidar system includes beam optics, which are able to swivel at least partially, are at least configured to deflect at least one beam emitted by the emitter unit in different directions for scanning a surrounding area, and are configured to deflect light reflected by the surrounding area to the detector unit; due to the deflection of the beam optics, the at least one light beam being transmitted through different sections of the window; and the control unit being configured to correlate the current deflection position of the beam optics and the intensity of the scattered light detected by the secondary detector, in order to calculate a position of an interference source on or in the window. In lidar systems, it is normally markedly more economical and less complex to allow the lidar sensor itself or elements of its beam optics to swivel/rotate, in order to scan the surrounding area for obstacles, than to provide separate emitters and detectors of the lidar sensor for each angular section. In this context, the scanning of the surrounding area is often carried out, using a time-of-flight (ToF) method, in which the time lag between emission of a light signal and detection is measured in order to determine the distance from surrounding-area objects. In this specific embodiment, the control unit is at least configured to carry out a one-dimensional determination of the position of interference sources (along the swivel direction of the light beam). To determine the position of an interference source as accurately as possible, the control unit is preferably calibrated with regard to the relationship of the deflection position of the beam optics relative to the expected intensity of the scattered light. If, for example, the interference source is relatively close to the secondary detector, then a higher intensity would be expected in response to an interference source than if an identical interference source lies further away, and therefore, from a purely geometrical standpoint, and due to the repeated reflection of the scattered light, less scattered light reaches the secondary detector(s).

In accordance with an example embodiment of the present invention, the lidar system preferably includes at least two secondary detectors, which are positioned on coupling-out surfaces at different positions of the window; the control unit being configured to calculate a position of an interference source on or in the window from the differences in intensity of the scattered light signals detected by the secondary detectors. If two or more secondary detectors are situated at different positions along one or more coupling-out surface(s), then the closer the interference source lies to the respective secondary detector, the higher the scattered light intensity is expected to be. The control unit may then be configured to calculate a (one-dimensional or two-dimensional) position of the interference source from the different intensity signals of the secondary detectors. However, if several interference sources are present simultaneously on the window (e.g., a number of rain drops), a position determination is rendered considerably difficult or even becomes impossible due to the comparison of the scattered light intensities alone. However, if the lidar system has beam optics capable of being at least partially swiveled, as in the previous specific embodiment, then at least a one-dimensional determination of the position of the interference source(s) is always possible by correlation with the deflection angle of the light beam.

In one preferred specific embodiment of the present invention, the at least one light source emits in a limited wavelength range. In particular, the light source is a laser, which emits in the near infrared range; a wavelength filter, in particular, a band-pass filter, which is transparent in at least the wavelength range of the light source, being situated between the coupling-out surface and the at least one secondary detector. This specific embodiment allows influences of external light (e.g., sunlight, external light sources), which are not caused by interference sources on or in the window, to be reduced, and therefore allows the detection of interference sources of the lidar system to be rendered more accurate. The band-pass filter preferably has a width at half maximum intensity about a central wave length (e.g., the wavelength of the light source) of less than 50 nm, preferably, less than 25 nm, particularly preferably, less than 15 nm. In this case, near infrared is to be understood as the wavelength range of 780 nm to 3 μm.

Thus, in order to distinguish between external light and internal light, two criteria may be used. The one is the wavelength of the light. A band-pass filter, which has a high transmission at the wavelength of the lidar system and is in front of the secondary detector, will transmit mainly the light emitted by the lidar system. The other is the timing (in the case of lidar systems, which are based on transit-time measurements), since when an emitted light pulse arrives at the window, and how long its duration is, are known.

It is preferable for at least one secondary detector to be an avalanche photodiode, a single-photon avalanche diode, a gallium arsenide detector, or an indium gallium arsenide detector. These types of detectors have a high sensitivity and therefore facilitate the detection of small interference sources, as well, which produce little scattered light. Alternatively, however, ordinary photodiodes may also be used, in particular, if the cost is intended to be low and the light intensity of the light source is sufficiently high, so that sufficient scattered light is also generated by the interference sources. Gallium arsenide detectors or indium gallium arsenide detectors are particularly suitable, if the light source is a laser at 1550 nm, which has, in particular, higher eye safety than shorter-wavelength infrared lasers.

In one specific embodiment of the present invention, the control unit includes a database, which is configured to store a plurality of temporally offset measuring results of the scattered light measurements; the control unit being configured to distinguish temporary interference sources from permanent interference sources by comparing temporally offset measuring results. Thus, for example, after a restart of the lidar system, a new measurement of interference sources may be carried out and compared to the last, previously stored measurement, in order to determine if interference sources detected previously have possibly disappeared (e.g., since rain drops on the window have evaporated in the meantime).

The lidar system preferably includes a cleaning unit, which is configured to clean at least an outer side of the window, in order to remove temporary interference sources. The cleaning unit may include a liquid nozzle, which may apply, for example, a cleaning fluid to the window. The cleaning unit may include one or more mechanical cleaning devices, such as wipers. The control unit may be configured to activate the cleaning unit, if a predefined amount of scattered light (that is optionally a function of the deflection angle of beam optics) is detected by the secondary detector. Alternatively, or in addition, the control unit may also emit a warning signal to the user (e.g., to the driver of a vehicle), so that he/she may start a cleaning, e.g., by keystroke or voice command.

In one specific embodiment of the present invention, the control unit is configured to carry out an interference source measurement after completion of a window cleaning by the cleaning unit, and to compare the obtained measuring results to at least the last measuring results stored before it, in order to distinguish temporary interference sources from permanent interference sources. If the interference source disappears after the cleaning, then the control unit may assume that it was a temporary interference source (e.g., dirt or water drops).

In a further specific embodiment of the present invention, the control unit is configured to output an error message, if a permanent interference source is identified; the error message informing a user of the presence of the permanent interference source. If the interference source is still present after a cleaning, then the control unit may either start a new cleaning by the cleaning unit or inform the user of the probable presence of damage to the window (e.g., via an optical and/or acoustic warning signal).

The control unit is preferably configured to calculate a size and/or type of the interference source on or in the window from the intensity of the detected scattered light. The intensity of the scattered light measured by the secondary detector is a function of not only the distance between the interference source and the secondary detector, but also the size (and type) of the interference source. If the distance from the interference source may be calculated (if the lidar system includes beam optics capable of being at least partially swiveled and/or a plurality of secondary detectors), then the control unit may calculate the size (and possibly the type) of interference source from the intensity of the scattered light. Water drops may be distinguished from surface defects, if, as already described, the lidar system has a cleaning unit, in order to remove the water from the surface. Immediately after the window has dried, the remaining scattered light is caused, in all probability, by surface defects. Surface defects cause a repeatable signal at the secondary detector, while the effects of water/dirt change with time (e.g., droplets may aggregate due to rain or spray, droplets may move on the surface, droplets may dry, water/dirt may be removed by a cleaning unit).

Advantageous further refinements of the present invention described herein and are shown in the figures.

BRIEF DESCRIPTION OF THE DRAWINGS

Exemplary embodiments of the present invention are explained in greater detail with reference to the figures and to the following description.

DETAILED DESCRIPTION OF EXAMPLE EMBODIMENTS

Figure 1:
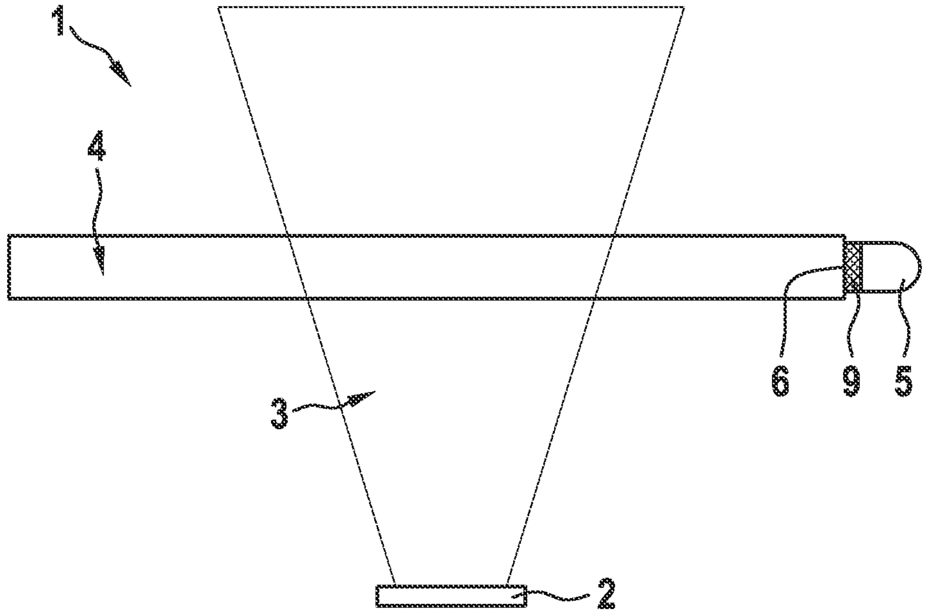
FIG. 1 shows a first specific embodiment of a lidar system of the present invention, not having interference sources on or in the window.
Figure 2:
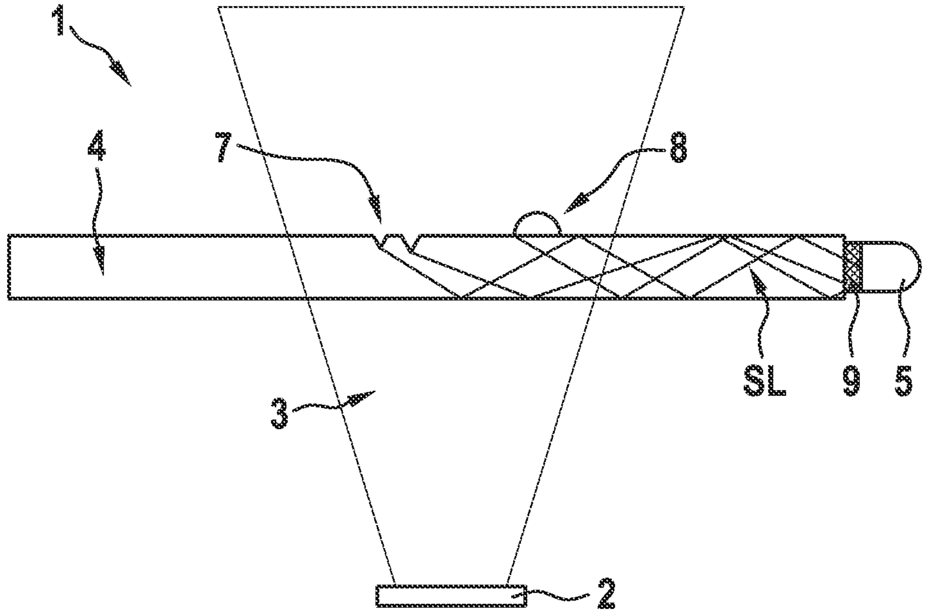
FIG. 2 shows the first specific embodiment, including interference sources on and in the window.

FIGS. 1 and 2 show a first specific embodiment of a lidar system 1 of the present invention, in particular, for a vehicle; the lidar system having interference source detection. An emitter unit 2 includes at least one light source (e.g., a laser). Lidar system 1 also includes a detector unit (not shown) having at least one primary detector, which is configured to detect reflected light of at least one light beam 3 emitted by emitter unit 2 for scanning a surrounding area, in order to detect surrounding-area objects. A housing includes a window 4, through which the light emitted by the emitter unit travels out of the housing and light reflected by the surrounding area arrives in the housing.

Lidar system 1 includes at least one secondary detector 5, which is attached to a coupling-out surface (lateral edge) 6 of window 4. Secondary detector 5 is configured to detect scattered light SL propagating inside of window 4. In contrast to FIG. 1, FIG. 2 shows a situation including interference sources 7, 8 on and in window 4, which each generate scattered light SL. A portion of this scattered light SL reaches secondary detector 5, e.g., via total internal reflection.

Lidar system 1 also includes a control unit (not shown), which is configured to evaluate scattered light SL detected by the at least one secondary detector 5, in order to detect interference sources 7, 8 on or in window 4. Interference source 7 is a scratch or crack in the surface of window 4, while interference source 8 is a water drop, that is, a temporary interference source.

The at least one light source emits in a limited wavelength range and is preferably a laser that emits, e.g., in the near infrared range, which has proven, in practice, to be advantageous for lidar systems. A wavelength filter 9, such as a band-pass filter, which is transparent in at least the wavelength range of the light source, is situated between coupling-out surface (lateral edge) 6 and the at least one secondary detector 5.

FIGS. 1 and 2 show, purely illustratively, a planar window 4, which may have the shape of, e.g., a right parallelpiped. However, other flat shapes, such as a circular cylinder or an elliptical cylinder, are possible; in each instance, secondary detector(s) 5 being positioned along a coupling-out surface (short lateral edge) 6 (which, in this case, runs parallelly to the direction of passage of light beam 3), which means that they may detect scattered light, which propagates perpendicularly to the direction of passage of light beam 3.

Figure 3:
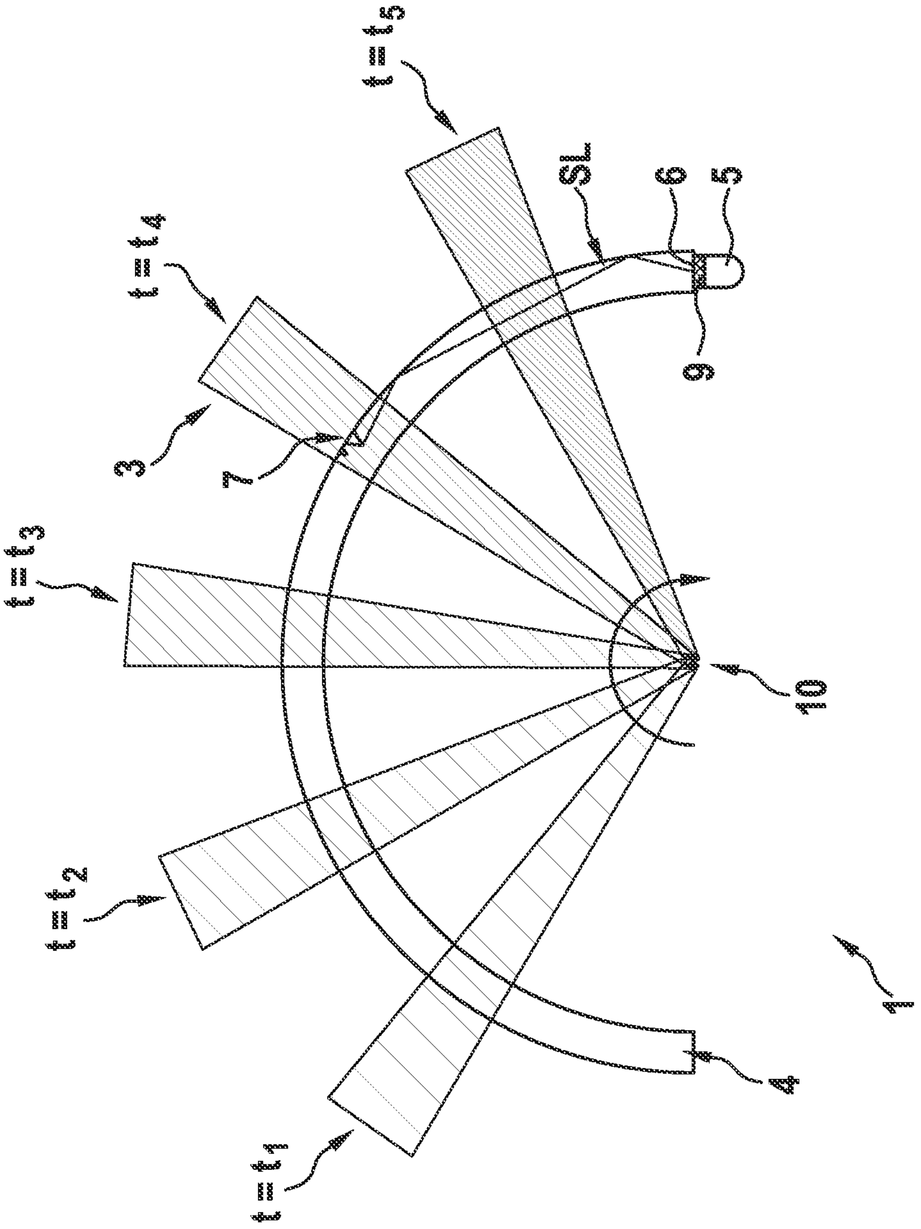
FIG. 3 shows a second specific embodiment of a lidar system of the present invention, including interference sources in the window.

FIG. 3 shows a top view of a second specific embodiment of a lidar system 1 according to the present invention, where corresponding elements are denoted by the same reference numerals. In this case, window 4 has, by way of example, the shape of a semicylindrical shell. Thus, lidar system 1 scans somewhat less than 180° of a surrounding area. However, greater or lesser angular ranges are also possible; window 4 then being able to occupy a correspondingly larger or smaller polar angle range.

In this case, lidar system 1 includes beam optics 10, which are able to swivel, are at least configured to deflect at least one light beam 3 emitted by the emitter unit (which is not shown here and is positioned, e.g., in a plane below or above the depicted rotary mirror of beam optics 10) in different directions for scanning a surrounding area, and are configured to deflect light reflected by the surrounding area to the detector unit. Due to the deflection of beam optics 10, the at least one light beam 3 is transmitted through different sections of window 4 at different times $t=t_1$, $t_2$, $t_3$, $t_4$, $t_5$. The control unit is configured to correlate the current deflection position of beam optics 10 and the intensity of the scattered light SL detected by secondary detector 5, in order to calculate a position of an interference source 7 on or in window 4. Thus, at time $t=t_4$, secondary detector 5 will detect an increase and then a decrease in the intensity of scattered light SL, which is not measurable at the other times $t=t_1$, $t_2$, $t_3$, $t_5$. From this, the control unit may deduce that an interference source 7 is present at the section of window 4, which corresponds to the angle of rotation of beam optics 10 at time $t=t_4$. In addition, the control unit may then also calculate the size of the interference source from the intensity of scattered light SL (in view of the functional relationship of the intensity of scattered light SL and the distance between interference source 7 and secondary detector 5.

Figure 4:
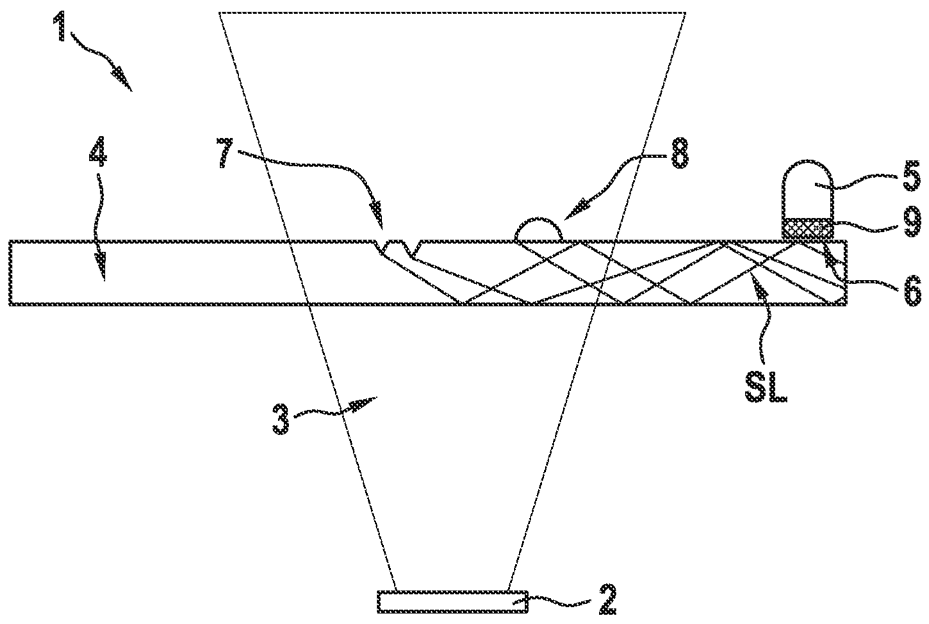
FIG. 4 shows a third specific embodiment of a lidar system of the present invention, including interference sources on and in the window.

FIG. 4 shows a top view of a third specific embodiment of the lidar system 1 of the present invention, similar to the first specific embodiment, where corresponding elements are denoted by the same reference numerals. However, in contrast to FIG. 1 and FIG. 2, coupling-out surface 6 is positioned at an outer side of window 4, contrary to the main transmission direction through the window, and adjacent to a lateral surface or lateral edge of window 4. In this case, as well, although the secondary detector is positioned contrary to the main transmission direction of window 4, virtually only scattered light reaches secondary detector 5, since (as drawn in) the secondary detector is situated outside of the region of window 4 covered by emitted light beam 3.

Although the present invention has been illustrated and described in greater detail, using preferred exemplary embodiments, the present invention is not limited by the examples described, and other variations may be derived from this by one skilled in the art, without departing from the scope of protection of the present invention.

What is claimed is:

1. A lidar system for a vehicle having interference source detection, the lidar system comprising:

an emitter unit having at least one light source, the emitter unit configured to emit a primary lidar beam for scanning a surrounding area to detect objects in the surrounding area;

a detector unit having at least one primary detector, which is configured to detect reflected light of the primary lidar beam emitted by the emitter unit;

a housing having a window through which the primary lidar beam travels out of the housing and light reflected by the surrounding area arrives in the housing;

at least one secondary detector directly attached to a coupling-out surface of the window, the secondary detector being configured to detect scattered light propagating inside of the window, wherein at least a portion of the scattered light originates from the primary lidar beam emitted by the emitter unit; and a control unit configured to evaluate scattered light detected by the at least one secondary detector to detect interference sources on or in the window.

2. The lidar system as recited in claim 1, wherein the at least one light source emits in a limited wavelength range and is a laser, which emits in the near infrared range, and a wavelength filter which is transparent in at least the wavelength range of the light source, is situated between the coupling-out surface and the at least one secondary detector.

3. The lidar system as recited in claim 2, wherein the wavelength filter is a band-pass filter.

4. The lidar system as recited in claim 1, wherein at least one of the at least one secondary detector is an avalanche photodiode, or a single-photon avalanche diode, or a gallium arsenide detector, or an indium gallium arsenide detector.

5. The lidar system as recited in claim 1, further comprising:

a cleaner configured to clean at least an outer side of the window to remove temporary interference sources.

6. The lidar system as recited in claim 1, wherein the control unit is configured to calculate a size and/or type of an interference source on or in the window from an intensity of the detected scattered light.

7. A lidar system for a vehicle having interference source detection, the lidar system comprising:

an emitter unit having at least one light source;

a detector unit having at least one primary detector, which is configured to detect reflected light of at least one light beam emitted by the emitter unit for scanning a surrounding area, in order to detect objects in the surrounding area;

a housing having a window through which the light emitted by the emitter unit travels out of the housing and light reflected by the surrounding area arrives in the housing;

at least one secondary detector attached to a coupling-out surface of the window, the secondary detector being configured to detect scattered light propagating inside of the window;

a control unit configured to evaluate scattered light detected by the at least one secondary detector to detect interference sources on or in the window; and beam optics which are able to swivel at least partially, and are configured to deflect at least one beam emitted by the emitter unit in different directions for scanning a surrounding area, and are configured to deflect light reflected by the surrounding area to the detector unit;

wherein due to the deflection of the beam optics, the at least one light beam is transmitted through different sections of the window, and the control unit is configured to correlate a current deflection position of the beam optics and an intensity of the scattered light detected by secondary detector to calculate a position of an interference source on or in the window.

8. A lidar system for a vehicle having interference source detection, the lidar system comprising:

an emitter unit having at least one light source;

a detector unit having at least one primary detector, which is configured to detect reflected light of at least one light beam emitted by the emitter unit for scanning a surrounding area, in order to detect objects in the surrounding area;

a housing having a window through which the light emitted by the emitter unit travels out of the housing and light reflected by the surrounding area arrives in the housing;

at least one secondary detector attached to a coupling-out surface of the window, the secondary detector being configured to detect scattered light propagating inside of the window; and a control unit configured to evaluate scattered light detected by the at least one secondary detector to detect interference sources on or in the window;

wherein the at least one secondary detector includes at least two secondary detectors which are positioned on coupling-out surfaces at different positions of the window, and wherein the control unit is configured to calculate a position of an interference source on or in the window from differences in the scattered light signals detected by the secondary detectors.

9. A lidar system for a vehicle having interference source detection, the lidar system comprising:

an emitter unit having at least one light source;

a detector unit having at least one primary detector, which is configured to detect reflected light of at least one light beam emitted by the emitter unit for scanning a surrounding area, in order to detect objects in the surrounding area;

a housing having a window through which the light emitted by the emitter unit travels out of the housing and light reflected by the surrounding area arrives in the housing;

at least one secondary detector attached to a coupling-out surface of the window, the secondary detector being configured to detect scattered light propagating inside of the window; and a control unit configured to evaluate scattered light detected by the at least one secondary detector to detect interference sources on or in the window;

wherein the control unit includes a database, which is configured to store a plurality of temporally offset measuring results of scattered light measurements, and the control unit is configured to distinguish temporary interference sources from permanent interference sources by comparing the temporally offset measuring results.

10. A lidar system for a vehicle having interference source detection, the lidar system comprising:

an emitter unit having at least one light source;

a detector unit having at least one primary detector, which is configured to detect reflected light of at least one light beam emitted by the emitter unit for scanning a surrounding area, in order to detect objects in the surrounding area;

a housing having a window through which the light emitted by the emitter unit travels out of the housing and light reflected by the surrounding area arrives in the housing;

at least one secondary detector attached to a coupling-out surface of the window, the secondary detector being configured to detect scattered light propagating inside of the window; and a control unit configured to evaluate scattered light detected by the at least one secondary detector to detect interference sources on or in the window;

wherein the control unit is configured to carry out an interference source measurement after completion of a window cleaning by the cleaning unit, and to compare measuring results to at least the last measuring results stored before them, in order to distinguish temporary interference sources from permanent interference sources.

11. The lidar system as recited in claim 9, wherein when a permanent interference source is identified, the control unit is configured to output an error message, which informs a user of a presence of the permanent interference source.

* * * * *